(12) United States Patent
Du et al.

(10) Patent No.: US 10,429,428 B2
(45) Date of Patent: Oct. 1, 2019

(54) ECU GROUND FAULT ISOLATION FOR A DELAY SYSTEM

(71) Applicant: GM GLOBAL TECHNOLOGY OPERATIONS LLC, Detroit, MI (US)

(72) Inventors: Xinyu Du, Oakland Township, MI (US); Shengbing Jiang, Rochester Hills, MI (US); Atul Nagose, Royal Oak, MI (US); Aaron B. Bloom, Royal Oak, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 492 days.

(21) Appl. No.: 15/340,043

(22) Filed: Nov. 1, 2016

(65) Prior Publication Data
US 2017/0153282 A1 Jun. 1, 2017

Related U.S. Application Data

(60) Provisional application No. 62/260,833, filed on Nov. 30, 2015.

(51) Int. Cl.
| | |
|---|---|
| *G06F 11/07* | (2006.01) |
| *G01R 31/00* | (2006.01) |
| *G01R 31/02* | (2006.01) |
| *G06F 11/34* | (2006.01) |
| *H04L 12/40* | (2006.01) |

(52) U.S. Cl.
CPC ......... *G01R 31/007* (2013.01); *G01R 31/025* (2013.01); *G06F 11/0739* (2013.01); *G06F 11/349* (2013.01); *H04L 2012/40215* (2013.01)

(58) Field of Classification Search
CPC .. G01R 31/005; G01R 31/006; G01R 31/007; G01R 31/024; G01R 31/025; G01R 31/088; G06F 11/0739; G06F 11/3013; G06F 11/349; H04L 2012/40215
See application file for complete search history.

(56) References Cited

U.S. PATENT DOCUMENTS

| | | | | |
|---|---|---|---|---|
| 2009/0183033 A1* | 7/2009 | Ando | .................. | H04L 43/0823 |
| | | | | 714/43 |
| 2014/0149801 A1* | 5/2014 | Jiang | .................. | G06F 11/2005 |
| | | | | 714/43 |
| 2014/0211344 A1* | 7/2014 | Pence | ...................... | H02H 7/06 |
| | | | | 361/20 |

FOREIGN PATENT DOCUMENTS

| | | |
|---|---|---|
| CN | 103455025 A | 12/2013 |
| CN | 104468176 A | 3/2015 |
| CN | 104468256 A | 3/2015 |

(Continued)

*Primary Examiner* — Son T Le
*Assistant Examiner* — Dustin R Dickinson
(74) *Attorney, Agent, or Firm* — Quinn IP Law

(57) ABSTRACT

A method of detecting a ground fault in a faulty electronic control unit. A ground fault detection technique executed by a processor is enabled. The processor determines a message count for each respective electronic control unit transmitted during a ground offset condition over a predetermined time period. The message count includes messages communicated within a communication bus having a measured voltage at least a predetermined voltage value above an expected voltage value. The message counts for each respective electronic control unit are normalized. The faulty electronic control unit is identified as a function of the normalized message counts. A fault signal is output to identify the fault electronic control unit.

21 Claims, 6 Drawing Sheets

(56) References Cited

FOREIGN PATENT DOCUMENTS

| CN | 104579816 A | 4/2015 |
|---|---|---|
| WO | 2015111762 A1 | 7/2015 |

\* cited by examiner

ECU GROUND FAULT ISOLATION FOR A DELAY SYSTEM

CROSS-REFERENCE TO RELATED APPLICATIONS

This application claims priority of U.S. Provisional Application Ser. No. 62/260,833 filed Nov. 30, 2015, the disclosure of which is incorporated by reference.

BACKGROUND OF INVENTION

The embodiments of the subject matter described herein relate generally to vehicle diagnostic systems. More particularly, embodiments of the subject matter relate to a methodology for localizing ground offsets associated with an electronic device.

Various types of systems including, but not limited to automobiles, utilize numerous electronic control units (ECUs) configured to control various vehicle subsystems, such as the engine, transmission, airbags, antilock braking, cruise control, electric power steering, audio systems, windows, communications, doors and mirror adjustments. While some of these subsystems are independent, others require an exchange of data among one another during operation of the vehicle. When an ECU either fails or is operational but faulty, the vehicle may exhibit degraded performance or be completely disabled.

An ECU on the vehicle may experience a ground offset condition. A ground offset condition occurs when an expected reference voltage (e.g., zero volts) of an ECU has shifted. If such a condition occurs, then if this shifted signal voltage is measured relative to different reference voltages, then different measured values will be obtained.

In an ideal network of ECUs, each of the reference voltages are identical such that all signal voltage measurements are consistent relative to one another. Ground offsets in the ECUs can result in inconsistent vehicle operation, due to changing electrical loading. Moreover, ground offsets tend to degrade over time rendering the faulty ECU inoperable.

SUMMARY OF INVENTION

An advantage of the invention is a detection of a ground fault and the identification of which electronic control unit (ECU) among a plurality of ECUs causing the ground fault. The system may be an onboard or off-board system and/or a diagnostic tool that can check the ground integrity of the ECUs onboard a host system for automatically identifying and locating the source of a ground offset in a network of ECUs. The diagnostic system utilizes message counts relating to voltage measurements of messages that exceed an expected target voltage. A message count relating to the high voltage measurements is determined and the count is normalized. The determination of the faulty ECU may be determined by identifying the ECU having the highest count or further analysis may be utilized were testing is preformed prior to installation and fault signatures generated and counts matching the fault signatures identifies the faulty ECU.

An embodiment contemplates a method of detecting a ground fault in a faulty electronic control unit. A ground fault detection technique executed by a processor is enabled. The processor determines a message count for each respective electronic control unit transmitted during a ground offset condition over a predetermined time period. The message count includes messages communicated within a communication bus having a measured voltage at least a predetermined voltage value above an expected voltage value. The message counts for each respective electronic control unit are normalized. The faulty electronic control unit is identified as a function of the normalized message counts. A fault signal is output to identify the fault electronic control unit.

DETAILED DESCRIPTION

Figure 1:
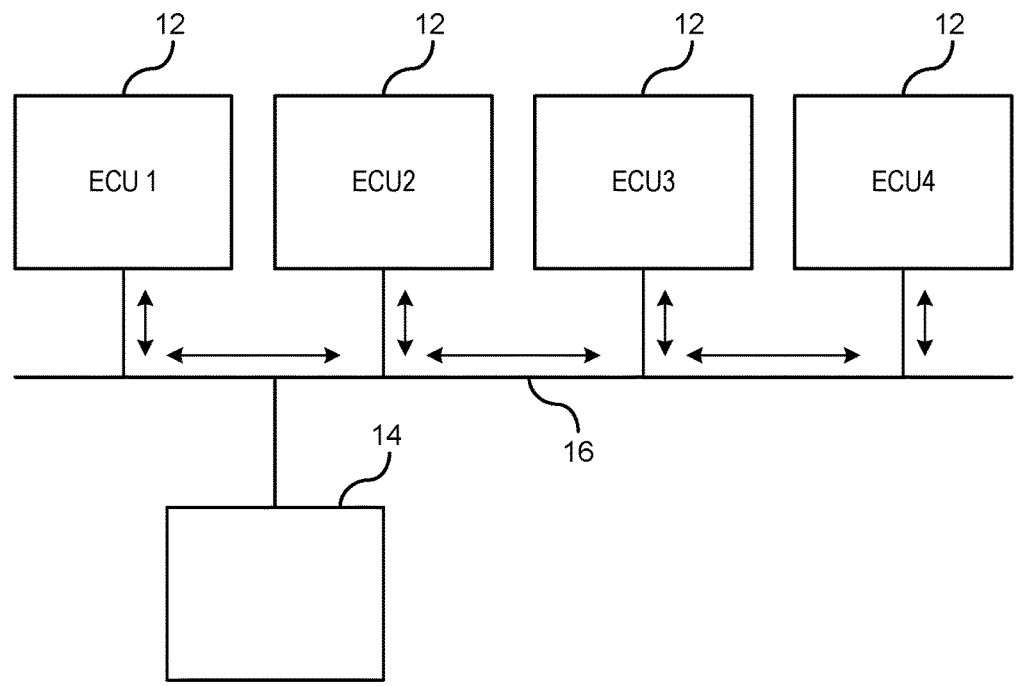
FIG. 1 is a schematic representation of a network of electronic devices.

The following detailed description is meant to be illustrative in understanding the subject matter of the embodiments and is not intended to limit the embodiments of the subject matter or the application and the uses of such embodiments. Any use of the word "exemplary" is intended to be interpreted as "serving as an example, instance, or illustration." Implementations set forth herein are exemplary are not meant to be construed as preferred or advantageous over other implementations. The descriptions herein are not meant to be bound by any expressed or implied theory presented in the preceding background, detailed description or descriptions, brief summary or the following detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. It should be appreciated that the various block components shown in the figures may be realized by any number of hardware, software, and/or firmware components configured to perform the specified functions. For example, an embodiment of a system or a component may employ various integrated circuit components, (e.g., memory elements, digital signal processing elements, logic elements, look-up tables, or the like, which may carry out a variety of functions under the control of one or more microprocessors or other control devices).

When implemented in software, various elements of the systems described herein are essentially the code segments or computer-executable instructions that perform the various tasks. In certain embodiments, the program or code segments are stored in a tangible processor-readable medium, which may include any medium that can store or transfer information. Examples of a non-transitory and processor-readable medium include an electronic circuit, a microcontroller, an application-specific integrated circuit (ASIC), a semiconductor memory device, a ROM, a flash memory, an erasable ROM (EROM), a floppy diskette, a CD-ROM, an optical disk, a hard disk, or the like.

The system and methodology described herein can be utilized to localize ground offsets in a network of electronic devices interconnected by a communication bus, such as an onboard vehicle communications network. The ground offset localization technique relies on bus voltage measurements and timestamping of the voltage measurements. While the approach and methodology are described below with respect to vehicle communications, one of ordinary skill in the art appreciates that an automotive application is merely exemplary, and that the concepts disclosed herein may also be applied to any other suitable communications system such as, for example, general industrial automation applications, manufacturing and assembly applications, and gaming.

The term "vehicle" as described herein can be construed broadly to include not only a passenger automobile, but any other vehicle including, but not limited to, motorcycles, trucks, sports utility vehicles (SUVs), recreational vehicles (RVs), marine vessels, aircraft, farming vehicles, and construction vehicles. The system and method described herein may further be implemented onboard a host vehicle (e.g., implemented in an ECU or any onboard processing module), or in an off-board diagnostic tool, device, or component that can be coupled to the vehicle network using a suitably configured interface. That is, the method described herein may be implemented on a service tool rather than on an ECU or gateway module. In addition, although described below with respect to a communications system that incorporates ECUs arranged as a controller area network (CAN), one of ordinary skill in the art appreciates that the method disclosed herein is equally applicable to any communication system utilizing a non-isolated multi-drop bus.

Referring now to the drawings, FIG. 1 is a simplified schematic representation of a network of electronic devices. It should be understood that the embodiment shown and described includes a network of ECUs 12 onboard a host vehicle, and may include more or less ECUs than shown. The ECUs may include the following common modules that include, but are not limited to, an engine control module; a transmission control module; a body control module; a telematics system control module; a rear differential control module; an electronic parking brake module; a human machine interface module; and an electronic brake control module.

FIG. 1 further illustrates a diagnostic system 14, which may be include, but is not limited to, an onboard module (such as another ECU); an onboard central gateway module that communicates with a plurality of different networks onboard the vehicle; an off-board or external diagnostic tool, device, or subsystem; or any suitably configured and compatible computer device. Each of the ECUs 12 are interconnected by a communication bus 16. The communication bus 16 is depicted as a single wire bus; however, the communication bus 16 can be realized as a two-wire bus or a bus greater than a two-wire bus. For simplicity purposes, FIG. 1 shows a single communication area network (CAN) having four ECUs. In practice, however, a vehicle can include many more than four ECUs (e.g., 30). It should be understood that the host vehicle may include a plurality of CANs, and that any respective ECU 12 may be a member of one or more wire buses.

In a conventional vehicle system, a typical network bus protocol is CAN, which is a multi-master broadcast serial bus standard designed to allow microcontrollers and other devices to communicate with each other within the host vehicle. The most common physical layer standard in the CAN protocol is the two-wire balanced signaling scheme defined by ISO-11898-2 (referred to as a high speed CAN). This standard specifies a two-wire differential bus wherein the number of nodes is limited by the electrical bus load. Each ECU that is a member of the CAN is connected to the two bus wires. The two-bus wires are identified as CAN High and CAN Low. In certain exemplary non-limiting embodiments, the common mode voltage ranges from 1.5 volts on CAN Low to 3.5 volts on CAN High. More specifically, the voltage on CAN Low is generally in the range of about 1.5 to 2.5 volts, while the voltage on CAN High is generally in the range of about 2.5 to 3.5 volts.

Each of the nodes on the communication bus 16 is able to send and receive messages, but not simultaneously. Each message (also referred to as a CAN frame) includes data, along with some identifying information that can be read and interpreted as needed. The identifying information is conveyed in the arbitration field of the message. The arbitration field also serves as a priority identifier that represents the priority of the message, wherein messages with lower priority identifier values have a higher priority than messages with higher priority identifier values, and are therefore transmitted first. A priority identifier must be uniquely assigned to only one ECU, otherwise two different ECUs could win arbitration at the same time, which would cause bus errors. Consequently, the priority identifier also functions as a source identifier that is uniquely mapped to one and only one ECU. A respective ECU can have more than one source identifier uniquely mapped thereto.

The CAN protocol includes a recessive state and a dominant state. A differential voltage is used to represent recessive and dominant states (i.e., bits). In the recessive state (logical 1), the differential voltage on CAN High and CAN Low is less than a minimum threshold. In the dominant state (logical 0), the differential voltage on CAN High and CAN Low is greater than a minimum threshold. Data in a CAN network is transmitted in messages, which are more commonly referred to as frames. A given CAN frame is separated from preceding frames by a bit field known as an inter-frame space, which includes at least three consecutive recessive bits. Following these consecutive recessive bits, if a dominant bit is detected, that bit is regarded as a "start of frame" bit for the next frame.

Each ECU 12 generally includes a processor or a microcontroller, a memory storage device, a CAN controller, and a transceiver. The ECU microcontroller controls the relay of messages and is often connected to sensors, actuators, and control devices. The CAN controller is often an integral part of the microprocessor and is configured to store the received serial bits from the communication bus 16 until an entire message is available, which can then be obtained by the ECU microcontroller. The CAN controller is also configured to receive messages transmitted by the microprocessor, which are then serially transmitted as bits onto the communication bus 16. The transceiver converts the data stream from the levels utilized by the CAN into levels that the CAN controller can process, and vice versa.

Figure 2:
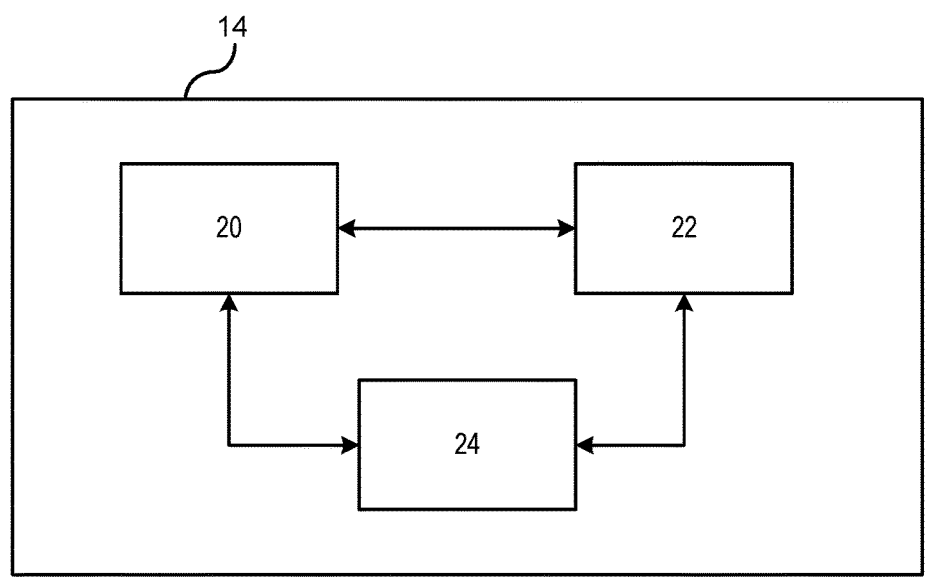
FIG. 2 is a diagnostic system diagnosing module faults.

FIG. 2 illustrates the diagnostic system 14 representing a system for diagnosing a CAN onboard a host vehicle to locate the source of ground offsets. The diagnostic system 14 is exemplary and can be implemented as an onboard component, subsystem, or module, or it can be implemented as an off-board device or component that can be coupled to the communication bus 16 as needed to perform various functions. FIG. 2 further illustrates a simplified representation of the diagnostic system 14. In some embodiments, the diagnostic system 14 can be implemented in a respective module onboard the host vehicle, wherein the respective module is coupled to the ECUs 12 via the communication bus 16. It should be understood that any module can serve as the diagnostic node. The respective module may also serve as a centralized interface that communicates with a plurality of different CANs onboard the host vehicle. Thus, the respective module can perform diagnostic procedures (including ground offset detection) for more than one CAN onboard the vehicle. In other embodiments, the diagnostic system 14 can be realized as a diagnostic tool external to the host vehicle (i.e., an off-board tool). The diagnostic tool includes a suitably configured interface to establish communication with the communication bus 16, as shown in FIG. 1. For example, the diagnostic tool can be realized as a computer system (e.g., a laptop, tablet, or mobile device) having a connection cable that is compatible with a plug, jack, or interface onboard the host vehicle.

The diagnostic system 14 generally includes at least one processor 20 and at least one storage device 22 that is associated with the processor 18. Alternatively, the processor 20 and the storage medium 22 can be implemented as a single integrated circuit component, such as a microcontroller or an ASIC. The diagnostic system 14 may also include certain input/output (I/O) features 24. In the vehicle system, the diagnostic system 14 may include or cooperate with additional elements, devices, components, or features that support additional functionality or that support the techniques and methodologies described herein.

The storage device 22 (or another memory device or component) can represent a tangible and non-transitory electronic storage medium having processor-executable instructions stored therein. The processor 20 executes instructions stored in the storage device 22 to perform a method of locating a source of a ground offset in a network of electronic devices (e.g., a vehicle-based CAN). The diagnostic system 14 may execute instructions that effectively transform what might be a general purpose computing platform into a specialized piece of equipment that supports the techniques, technologies, and methodologies presented herein. This is particularly applicable to an external off-board implementation that might leverage a computer device.

The I/O features 24 may initiate or control the functionality of the diagnostic system 14 and/or to generate suitably formatted outputs as needed. In the vehicle system, the I/O features 24 may include, for example, a CAN transceiver, an analog-to-digital (A/D) converter, or similar. The I/O features 24 can identify one or more of the ECUs as a potential source of a ground offset. In certain embodiments, the I/O features 24 can generate diagnostic trouble codes that indicate ground offset conditions detected by the diagnostic system 14, while in other embodiments, the I/O features 24 are used to issue fault signals such as alerts or warning messages, to generate diagnostic reports, to display test results, or the like. These and other reporting functions can be supported by the diagnostic system 14 as needed, and as appropriate to the particular embodiment.

The diagnostic system 14 executes computer-readable instructions to monitor the voltage characteristics of the messages on the communication bus 16 for purposes of identifying an ECU with a ground offset.

Figure 3:
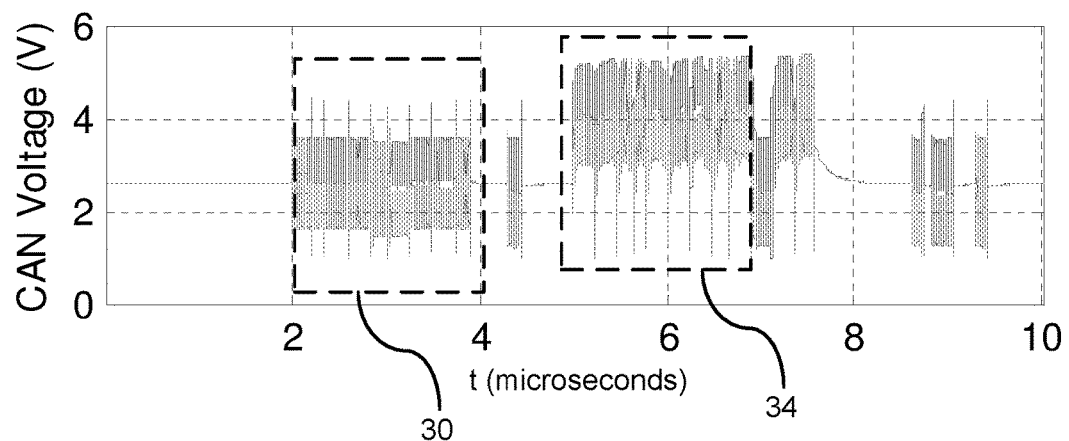
FIG. 3 illustrates exemplary voltage signal characteristics for a plurality of CAN messages.

FIG. 3 is a diagram that illustrates signal voltage characteristics of a CAN having multiple ECUs. In FIG. 3, an upper "half" of the voltage signal corresponds to CAN High, and a lower "half" of the voltage signal corresponds to CAN Low. A region generally designated as 30 represents a respective set of frames having no ground fault present in the set of frames. A typical expected CAN voltage signature when all ECU grounds are normal with an average frame and inter-frame voltage being about 2.5 volts.

Figure 4:
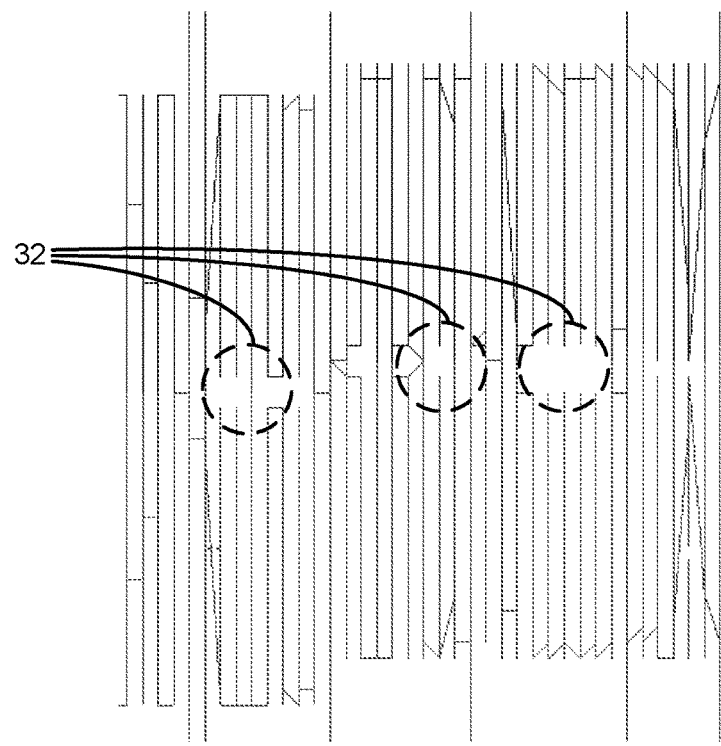
FIG. 4 is an enlarged view of the signal of FIG. 3.

FIG. 4 illustrates an enlarged view of a portion of the signal of region 30 to illustrate that the respective set of frames include various messages transmitted by one or more ECUs in serial transmission. As shown in FIG. 4, breaks 32 in the vertical lines of the signal represent an end of a previous message and a start of a next message. As shown, various messages may be transmitted on the CAN within this respective time frame having different transmission rates and have different transmission lengths. As a result, a break in a transmission signal identifies a count representing a message. By identifying the number of breaks in a voltage signal for a respective time period determines the number of counts (i.e., messages) transmitted over the respective time period.

Referring again to FIG. 3, the peak voltages in each of the respective set of frames in region 30 are relatively stable and consistent at about 3.5 volts for CAN High and about 2.5 volts for CAN Low. In addition, the average frame voltage for each of the measured voltages is relatively stable and consistent at about 2.5 volts. These characteristics are indicative of properly grounded ECUs where no ground offset is present in any of the ECUs for this respective set of frames in region 30.

It should be understood that the respective set frames include messages transmitted in quick succession. It should be understood that each of the ECUs can transmit messages on the CAN at different schedules and each message can be of different transmission lengths dependent on the amount of data content within the message. As a result, the message transmission rate can vary from one ECU to another. For example, a respective ECU can transmit a given message at respective transmission periods. Accordingly, some ECUs generate a higher percentage of the messages transmitted on the CAN, and other ECUs generate a relatively low amount of the message traffic.

Also shown in FIG. 3, generally designated by region 34, is a set of frames that illustrates signal voltage characteristics that are indicative of a ground offset condition. In comparison to region 30 where no ground offset is present, the respective set of frames 34 are offset (i.e., shifted upward) which has voltage characteristics that are indicative of a ground offset condition. In this example, the ECUs that originated these respective set of messages has its ground voltage pulled up (its ground voltage is greater than reference zero). This ground offset causes both CAN High and CAN Low to be pulled up when the faulty ECU transmits a message. The ground offset condition caused by the ECU causes other messages to be upwardly shifted relative to the levels of the other messages. As shown in region 34 in FIG. 3, a peak voltage for these respective set of frames is approximately 5.5 volts for CAN High compared to a healthy voltage signal of 3.5 volts shown in region 22. In addition, these respective set of frames is approximately 4.0 volts for CAN Low compared to a healthy voltage signal of 2.5 volts shown in region 30. As a result, the average peak frame voltage of the set of frames 34 has also been shifted upward by about 1.5 volts to a value of approximately 4.0 volts.

Methods are known to analyze a region indicating a ground offset to determine faulty ECUs by determining which ECU has the highest count for the respective region identifying the ground-offset. To determine which ECU is faulty, the data within each message must be analyzed for identifying which ECU transmitted the message. Each message contains a message header that includes an identifier identifying the transmitting module. As described earlier, known techniques measure the voltage of the message on the CAN and then determine the module transmitting the message based on the identifier in the message. However, this type of technique may yield inaccurate results, since the voltage measurement and the identification of the message are not synchronized. A single microcontroller voltage sensor may be used to measure all voltages transmitted on the CAN, and a voltage measurement of a signal can be determined instantaneously by a microcontroller voltage sensor. However, in regards to analyzing the data in the message to determine the transmitting module, a delay occurs between the time when the voltage is measured by the microcontroller voltage sensor and the time the message is analyzed by the CAN controller for determining the identifier. As a result, the count may be incorrectly associated with the wrong message because the delay in reading the data in the message. In other words, an ECU may be incorrectly associated with a voltage reading signal since reading the header data may be for a prior frame (message) as opposed to the present frame (message) since the identifier cannot be instantaneously read at the time the voltage measurement is taken due to the delay. Various techniques may be used to obtain the message data including increasing the window size. Too large of a delay may not properly capture the correct message identifier, whereas too large of a window may capture too much data. As a result, the technique herein utilizes a predetermined window size and a predetermined delay. Preferably, the delay is two milliseconds (i.e., 2 ms). The optimum window for measuring the high CAN voltage is substantially equal to the sum of the delay+250 µs). While this technique assists in more accurately identifying the counts for each ECU, a deficiency still exists in including different counts of messages from different message periods.

Figure 5A:
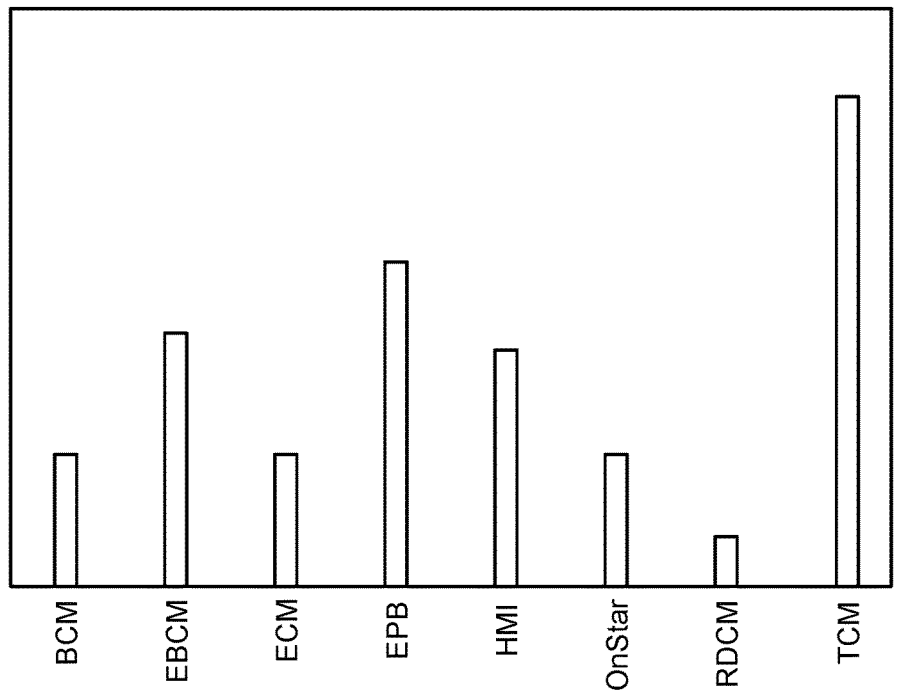
FIG. 5a illustrates an exemplary table of frame counts during a ground offset condition.

To overcome this deficiency, the data is normalized. FIG. 5a illustrates a table where frames (i.e., messages) are counted for each respective module that transmitted a message in a window during the ground offset. In FIG. 5a, an optimal window size for obtaining voltage measurements should be equal to 250 µs. It should be understood that this respective parameter is adjustable. Messages are read by the CAN controller after a delay of time (e.g., 2 ms) from the determined window. The normalization process analyzes the data as a percentage of the number of messages with high voltage for a respective ECU relative to the total number of messages for the ECU. This expression is represented by the following formula:

$$C_n = \frac{\text{Number of Messages with High Voltage}}{\text{Total Number of Messages}}$$

Figure 5B:
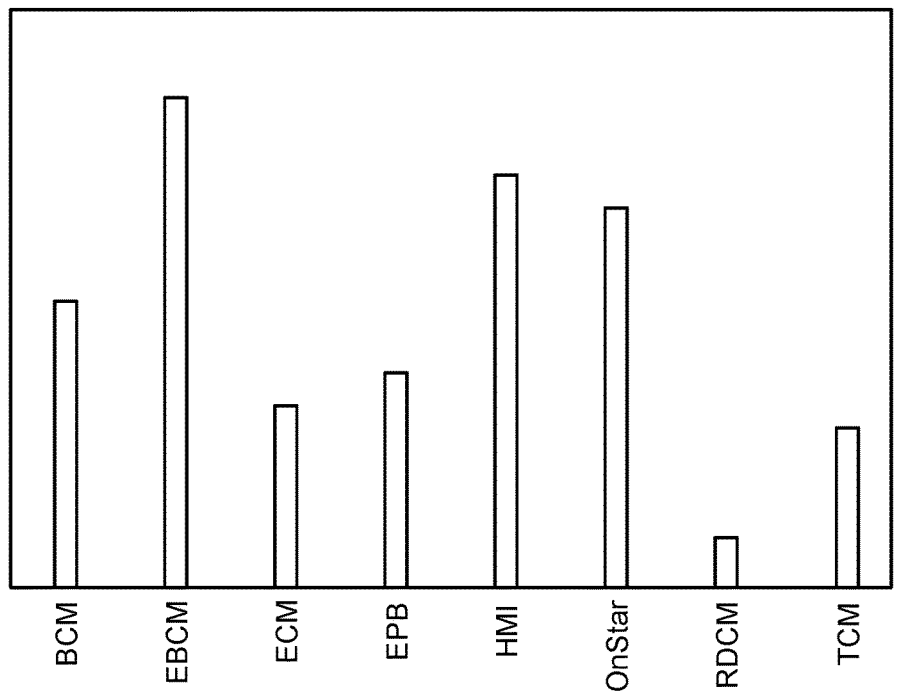
FIG. 5b illustrates count data in normalized format.

FIG. 5b represents the ground fault data of FIG. 5a in a normalized format. The normalization of the data removes any skewing of the data. A candidate ECU may be selected based on the respective ECU having the highest count in the normalized data graph illustrated in FIG. 5b.

In a second preferred embodiment, an isolation technique is applied based on the frequency of high voltage frames. This technique bases its analysis on a message frequency of the high voltage frame being equal to a message frequency sent by the faulty ECU. The routine determines a fault signature of high voltages based on the number of messages that each ECU transmits within a respective period. That is, the high voltage fame count over during a respective window is compared to a predetermined fault signature table that includes a fault signature of each of the ECUs. If the number of frequency of voltage frame value is within the fault signature range in the table, then the ECU associated with the identified fault signature range is identified as the faulty ECU.

Figure 6:
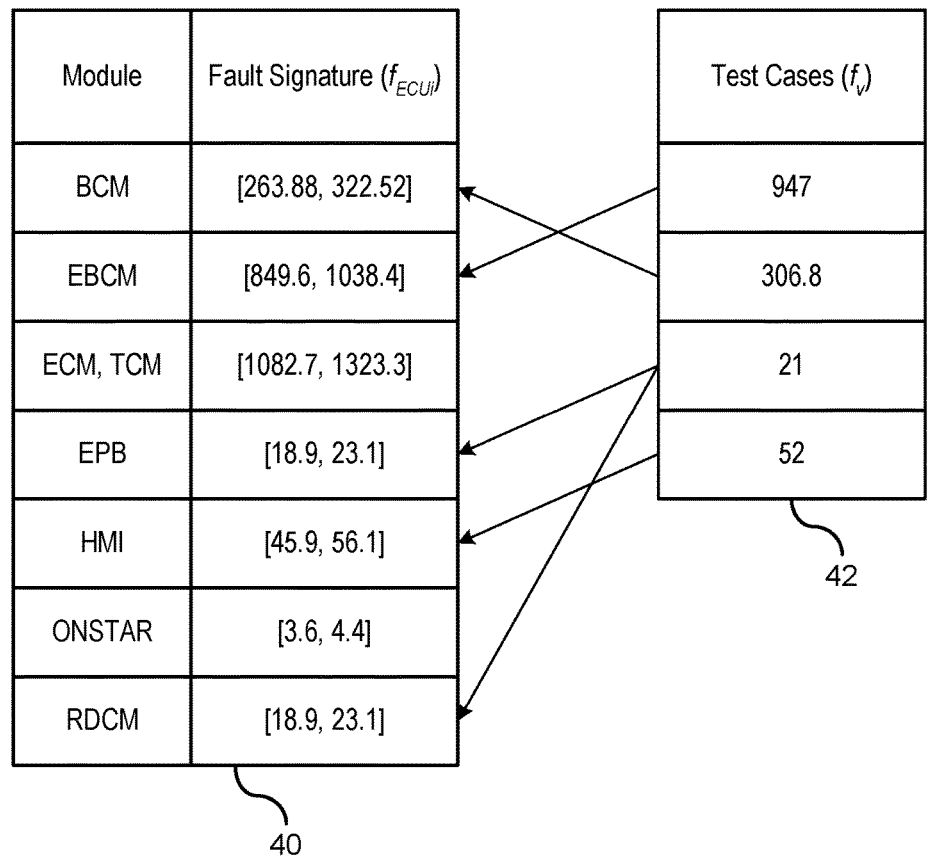
FIG. 6 is an exemplary table illustrating ECU and associated fault signatures.

The fault signature is determined based on the number of messages transmitted within a respective period of time. The frequency signature for any ECU can be determined based on the following formula:

$$f_{ECUi} = \Sigma_{j=0}^n C_j/P_j$$

where $C_j$ is a number of messages within period $P_j$. For each respective fault signature for a respective ECU, a predetermined uncertainty threshold $(+\varepsilon, -\varepsilon)$ is applied to the to the respective fault signature for obtaining a fault signature range for each respective ECU. This table can be generated by inducing faults for a respective ECU or a combination of ECUs into a test bed or test vehicle and identifying the fault signature for that respective ECU or a combination of ECUs. An exemplary table 40 identifying the ECUs and associated fault signatures is illustrated in FIG. 6.

After the frequency signatures are determined for each ECU and ECU combinations, the fault signature table 40 is implemented in the vehicle. During the operation of the vehicle when ground faults are detected, high voltage measurements are obtained for a respective window. A frequency of voltage frame is determined with respect to high voltage values measured. The frequency of voltage frame is represented by the following equation:

$$f_V = \frac{\text{High Voltage Frame Count}}{W}$$

where W is the window size. Once the frequency of voltage frame determined, then the value determined for the frequency of voltage frame is compared with the fault signature table 40 and a determination is made as to which frequency range the determined value resides. Table 42 further illustrates an exemplary calculated frequency of voltage frame values that can be compared to the respective frequency signature range table 40 for identifying a faulty ECU candidate. If the frequency of voltage frame value falls within a frequency signature range, then the faulty ECU is identified based on the ECU associated with the respective frequency signature range.

Figure 7:
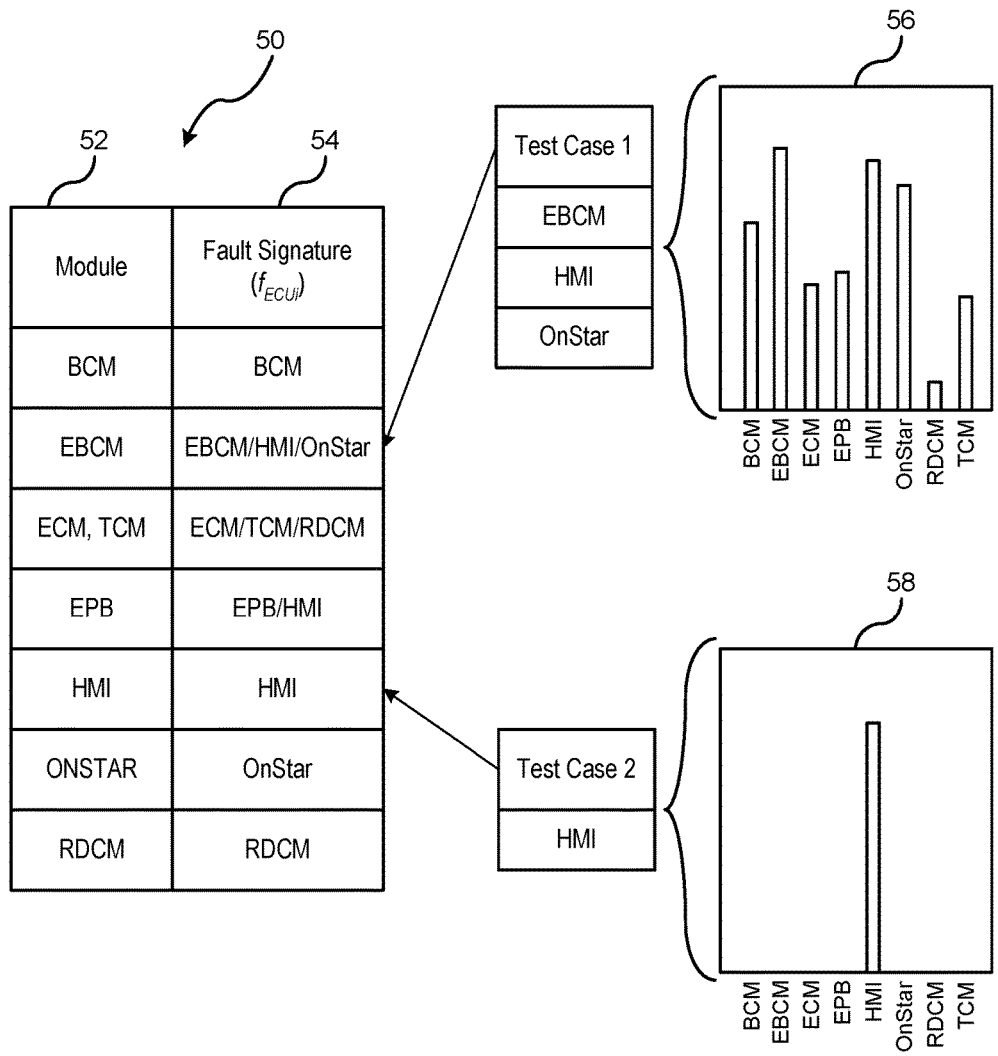
FIG. 7 illustrates exemplary tables for pattern matching correlation.

FIG. 7 illustrates a third embodiment for determining the faulty ECU associated with the ground offset. The technique described in FIG. 7 utilizes a pattern matching correlation. Utilizing the normalization technique as described in herein, normalization values are determined for each ECU for a respective window. In a previous embodiment, the ECU having the highest count is identified as the faulty ECU. In the embodiment described herein, the three ECUs having the highest counts are utilized for comparison with a fault signature table. The fault signature table is generated by inducing faults for a respective ECU or a combination of ECUs into a test bed or test vehicle and identifying the fault signature for that respective ECU as well as other ECUs during window. In contrast to identifying the ECU with the highest number of counts among all the ECU counts for the fault signature, the three ECUs having the highest counts among each of the ECUs transmitting messages during that window when the ground offset is occurring are utilized for generating the fault signature for that ECU. As a result, a more robust method is utilized by adding additional details to the fault signature. That is, the more details that are utilized for identifying the fault signature, the more robust the technique will be in matching the pattern of the fault signature. It should be understood that a number other than three ECUs may be utilized herein as this number is adjustable, and may be modified based on a degree of desired robustness.

FIG. 7 illustrates a fault signature table 50 generated where the three highest counts among the listed ECUs are identified when a respective module or combination of modules were induced with a fault. As shown in fault signature table 50, the faulty module is identified in column 52 and the associated fault signature ($f_{ECUi}$) having the highest three counts among all the counts for the induced fault for that respective module are identified in column 54. It is shown that some fault signatures may be comprised of three modules, two modules, or a single module. The rationale as to why less than three modules may only comprise a respective fault signature is that less than three modules actually registered any counts during the respective fault window. As a result, there may not be a second or third module that can be used for a fault signature if no additional modules register faults for that respective window.

In FIG. 7, a first graph 56 represents normalized counts of ground faults identified while a ground offset is present. This exemplary graph represents counts for modules that transmitted messages during a respective window when the ground offset is detected and the counts are normalized. As shown in graph 56, the highest three modules (e.g., EBCM, HMI, and Onstar) among the plurality of modules that registered faults during this window are extracted from graph 56. A comparison of these three highest modules extracted from graph 56 are compared utilizing pattern matching with the fault signature table 50. If the pattern based on the extracted three modules from graph 56 match a respective fault signature from the fault signature table 50, then the respective faulty module associated with the identified fault signature is selected for identifying the faulty module. In this example the EBCM module is selected.

A second graph 58 represents normalized counts of ground faults identified while a ground offset is present. This exemplary graph represents counts for modules that transmitted messages during a respective window when the ground offset is detected and the counts are normalized. The counts are normalized as illustrated in the graph 58. As shown in graph 58, only a single module (e.g., HMI) transmitted messages during this respective window when the ground fault occurred. As a result, only the HMI module will make up the fault signature. This fault signature that only includes the HMI is compared to the fault signature table 50. If the pattern based on the single HMI module matches a respective fault signature from the fault signature table 50, then the respective faulty module associated with the identified fault signature is selected for identifying the faulty module. In this example, the faulty HMI module is identified.

Figure 8:
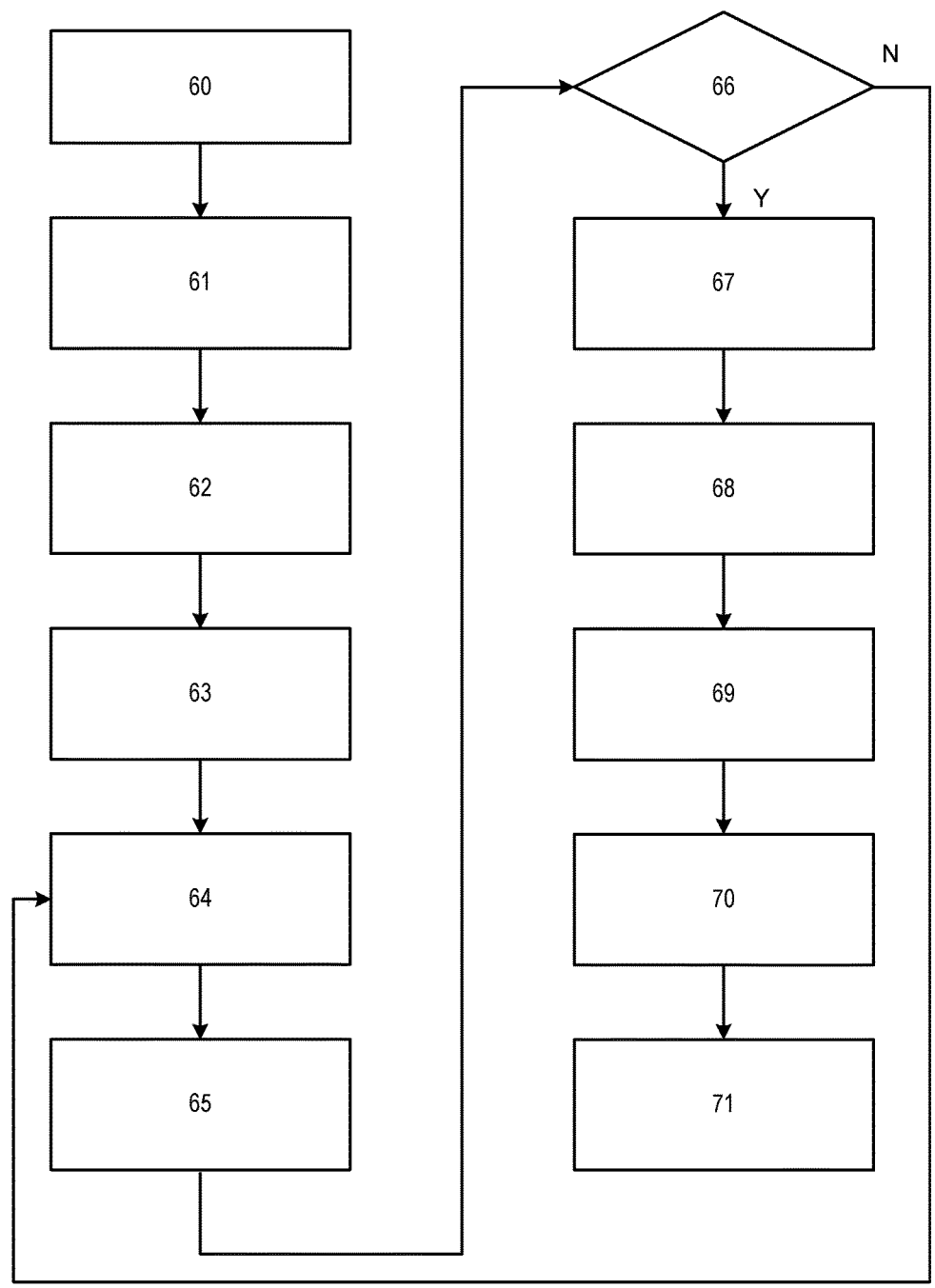
FIG. 8 illustrates flowchart of a method for determining a faulty module.

It should be understood that each of the embodiments as described herein can be implemented individually or in combination with one another. The following flowchart as illustrated in FIG. 8 describes an approach combining each of the three embodiments.

In block 60, a condition is detected that triggers the ground fault detection technique. In block 61, all variables for initialized.

In block 62, a $CAN_{High}$ voltage and a $CAN_{Low}$ voltage for a time $T_0$ (e.g., 1.0 sec) is read. The maximum voltages $V_{hmax}$ associated with $CAN_{High}$, and $V_{hmax}$ associated with $CAN_{Low}$ are stored.

In block 63, the high voltage threshold using $T_1$ and $T_2$ are determined. A determination for the high voltage threshold using $T_1$ is determined by max(Vhmax−1, 4). A voltage is selected from the maximum of either the difference of ($V_{hmax}$−1) volts or 4 volts. In addition, a determination for the high voltage threshold using $T_2$ is determined by max (Vhmax−1, 3). A voltage is selected from the maximum of either the difference of ($V_{hmax}$−1) volts or 3 volts.

In block 64, a $CAN_{High}$ voltage and a $CAN_{Low}$ is read for $T_3$ (e.g., 1.5 sec) is read. The time stamp is stored for $CAN_{High}$>$T_1$ and $CAN_{Low}$>$T_2$.

In block 65, points are deleted if the time difference is less than T4. The high voltage frames are thereafter counted. The technique described in FIG. 4 is applied to the high voltage frame count.

In block 66, a determination is made what the high voltage frame count matches any data ranges from the fault signature table shown in FIG. 4. If a match is present, then the routine proceeds to step 67; otherwise, the routine returns to block 64 the continue reading $CAN_{High}$ voltage and a $CAN_{Low}$ at a next time period.

In block 67, in response to identifying a match, the correlation routine as shown in FIGS. 5*a-b* is executed. The $CAN_{High}$ voltage and the $CAN_{Low}$ voltage is collected as well as the message from the candidate ECUs. The identifier from each message as described in the correlation routine is determined.

In block 68, voltages and messages are correlated within a predefined time window $T_5$.

In block 69, the counts based on the correlated voltages and messages are normalized using the technique described herein. The count having the highest value among the normalized values is identified and the associated ECU is identified.

If a more robust result is desired, then pattern matching may be applied using the normalized results in block 69. In block 70, the identified module is selected using the count pattern matching routine described in FIG. 7. Based on the pattern matching, the candidate ECU is identified as the faulty module.

In block 71, after a faulty ECU is identified, an alert may output to a user, service technician, or similar identifying the faulty module. The faulty module may be identified and stored in a memory for later retrieval by a service technician utilizing a service diagnostic tool.

While certain embodiments of the present invention have been described in detail, those familiar with the art to which this invention relates will recognize various alternative designs and embodiments for practicing the invention as defined by the following claims.

What is claimed is:

1. A method of detecting a ground fault in a faulty electronic control unit from among a plurality of electronic control units, the method comprising:
enabling a ground fault detection technique executed by a processor;
determining, by the processor, a message count for each respective electronic control unit transmitted during a ground offset condition over a predetermined time period, the message count including messages communicated within a communication bus having a measured voltage at least a predetermined voltage value above an expected voltage value;

normalizing the message counts for each respective electronic control unit to thereby generate a normalized message count for each respective one of the plurality of electronic control units, the normalized message count being a number of the messages having the measured voltage to a total number of the messages;

identifying the faulty electronic control unit as a function of the normalized message counts; and outputting a fault signal to identify the fault electronic control unit.

2. The method of claim 1, wherein the ground fault detection technique is enabled in response to detecting the ground offset on the communication bus.

3. The method of claim 1 wherein measured voltages are recorded for a respective message based on measuring voltages within a respective window time frame relative to when the respective message is analyzed.

4. The method of claim 3 wherein a length of the window time frame is set as a sum of a predetermined delay and a fixed length of time.

5. The method of claim 4 wherein the delay is substantially 2 msec.

6. The method of claim 4 wherein the fixed length of time is substantially 0.250 microseconds.

7. The method of claim 6 wherein the normalized message count for each respective one of the electronic control units is determined by the following formula:

$$C_n = \frac{\text{Number of Messages with High Voltage}}{\text{Total Number of Messages}}$$

wherein the Number of Messages with High Voltage is the number of messages having the measured voltage at least the predetermined voltage value above the expected voltage value, the Total Number of Messages is a sum of all voltage measurements recorded during the window time frame, and $C_n$ is the normalized message count.

8. The method of claim 7 wherein identifying the faulty electronic control unit as the function of the normalized message counts includes identifying the respective electronic control unit having a highest message count among each of the electronic control unit message counts.

9. The method of claim 1 wherein identifying the faulty electronic control unit as the function of the normalized message counts further comprises the steps of:

determining a fault signature for each electronic control module;

determining a frequency of voltage frame;

matching the frequency of voltage frame to at least one respective fault signature;

identifying the faulty electronic control unit as a function of pattern matching the frequency of voltage frame to at least one respective fault signature.

10. The method of claim 9 wherein the frequency of voltage frame is determined using the following equation:

$$f_v = \frac{\text{High Voltage Frame Count}}{W}$$

wherein the high voltage frame count is the number of messages having a measured voltage at least a predetermined voltage value above an expected voltage value, W is the window size, and $f_v$ is the frequency of voltage frame.

11. The method claim 9 wherein determining a fault signature for each respective one of the electronic control units includes generating a frequency count range for each respective one of the electronic control units.

12. The method of claim 11 wherein the fault signature for each electronic control unit is determined based on the following formula:

$$f_{ECUi} = \Sigma_{j=0}^{n} C_j/P_j$$

where $C_j$ is a number of messages, $P_j$ is a period of time, and $f_{ECUi}$ is the fault signature.

13. The method of claim 12 further comprising identifying the faulty electronic control unit in response to the frequency of voltage frame residing in a respective frequency count range of the faulty control unit.

14. The method of claim 13 wherein a plurality of faulty electronic control units is identified in response to the frequency of voltage frame residing in more than one fault signature.

15. The method of claim 12 wherein at least one of the plurality of electronic control units includes multiple fault signatures, wherein a predetermined number of the plurality of electronic control units having a highest normalized message counts among the plurality of electronic control units are identified, and wherein the respective electronic control unit having the multiple fault signatures associated with the highest normalized counts is identified as the faulty controller.

16. The method of claim 15 wherein a predetermined number of the plurality of electronic control units having the highest normalized message counts is greater than two.

17. The method of claim 16 wherein only a single fault signature is utilized if only a single electronic control module registered message counts during a fault window.

18. The method of claim 1 wherein trouble diagnostic codes are stored in a memory relating to the faulty electronic control unit.

19. The method of claim 1 wherein an alert relating to the faulty electronic control module is stored in a memory storage device for retrieval at a later time.

20. The method of claim 1 wherein the ground fault detection technique is executed in-vehicle.

21. The method of claim 1 wherein the ground fault detection technique is executed off-vehicle.

* * * * *